United States Patent [19]

Roberts et al.

[11] Patent Number: 4,583,800

[45] Date of Patent: Apr. 22, 1986

[54] SELF-ALIGNING ELECTRICAL CONNECTION ASSEMBLY

[75] Inventors: Joseph A. Roberts, Hudson; Thomas H. Stearns, Nashua, both of N.H.

[73] Assignee: Advanced Circuit Technology, Inc., Nashua, N.H.

[21] Appl. No.: 642,202

[22] Filed: Aug. 20, 1984

[51] Int. Cl.⁴ .............................................. H01R 9/09
[52] U.S. Cl. ................. 339/17 F; 339/75 M; 339/176 MF
[58] Field of Search ............ 339/17 F, 176 MF, 75 M

[56] References Cited

U.S. PATENT DOCUMENTS

| | | | |
|---|---|---|---|
| 4,169,641 | 10/1979 | Olsson | 339/17 F |
| 4,181,386 | 1/1980 | Olsson | 339/17 F |
| 4,252,392 | 2/1981 | Whiteman, Jr. | 339/176 MF |
| 4,334,728 | 6/1982 | Reynolds et al. | 339/17 F |
| 4,420,206 | 12/1983 | Martyniak | 339/17 F |
| 4,422,709 | 12/1983 | Croci et al. | 339/17 F |

Primary Examiner—John McQuade
Attorney, Agent, or Firm—Cesari and McKenna

[57] ABSTRACT

An electrical circuit connection assembly aligns the corresponding contacts of two fine-line printed circuits. The assembly includes an alignment plate affixed to one of the circuits which has flexible legs whose ends engage in converging guide slots on the other circuit when the corresponding contacts of the two circuits are in gross registration. When the two circuits are clamped together, those legs flex outward along the slots so that they are wedged by the slot walls laterally in one direction or the other until they are centered in their slots to achieve fine registration of those circuit contacts.

15 Claims, 4 Drawing Figures

SELF-ALIGNING ELECTRICAL CONNECTION ASSEMBLY

This invention relates to an electrical connection assembly. It relates more particularly to an assembly such as this which automatically aligns the corresponding contacts of the circuits being connected together.

BACKGROUND OF THE INVENTION

In computers and other electrical systems, it is often necessary to electrically connect the terminals of two printed circuits or to connect the terminals of a flexible circuit such as a jumper cable to terminals of a PC board. One way of accomplishing this is to expose segments of the circuit conductors and to clamp the flexible circuit to the PC board so that those segments are in register with the conductors or terminals of the PC board. An arrangement such as this is disclosed in U.S. application Ser. No. 416,490, filed Sept. 10, 1982, entitled FLEXIBLE CIRCUIT CONNECTION ASSEMBLY owned by the Assignee of the present application.

In the connector arrangement disclosed in the aforesaid application, a flexible jumper cable is mounted to the underside of a clamping connector with the conductors of the cable being exposed at the underside of the connector. The connector has two locating posts which project down below the cable and are arranged to engage in holes in the PC board to which the cable is being connected. The PC board has conductors or terminals located between those holes which correspond to the cable conductors so that when the connector posts are received in the PC board holes, the two sets of conductors are in register. Accordingly when the connector clamps to the PC board, a good electrical connection is made between each of the conductors or contacts of the flexible circuit and the corresponding conductors or terminals of the PC board.

The aforesaid arrangement works quite well when the conductors of the printed circuit and PC board are relatively wide (e.g., 0.01 inch) and widely spaced (e.g., 0.015 inch apart). But the cable and PC board are not positioned accurately enough by the aforesaid post-and-hole engagement of the connector and board to achieve proper registration of the cable and PC board conductors when those circuits are so called fine line circuits whose conductors are very narrow and closely spaced. A typical fine line circuit has conductors which are only 0.005 inch wide and 0.005 inch apart. As a result, it has not been feasible heretofor to use such clamping-type electrical connectors to couple fine line circuits.

SUMMARY OF THE INVENTION

Accordingly the present invention aims to provide a connection assembly that can make good electrical connections between the corresponding conductors of two circuits, especially two fine line circuits.

Another object of the invention is to provide an electrical connection assembly which enables two fine line circuits to be clamped together so that all of their corresponding conductors or terminals are in register.

Another object of the invention is to provide means for improving the electrical contacts between the corresponding conductors of two circuits which are clamped together.

Still another object is to provide a self-aligning connection assembly for electrically connecting the conductors of two fine line circuits.

Yet another object of the invention is to provide such an assembly which is relatively easy to make and to use.

Other objects will, in part, be obvious and will, in part, appear hereinafter.

The invention accordingly comprises the features of construction, combination of elements and arrangement of parts which will be exemplified in the following detailed description, and the scope of the invention will be indicated in the claims.

Briefly, the circuit to be connected to, say, a more or less standard PC board, usually has its various circuit paths terminated by a multiplicity of parallel conductor segments spaced close to one another usually, but not always, near an edge of the board. Spaced outboard of each outermost conductor segment is at least one alignment guide consisting of a pair of short, closely spaced raised guide strips which are printed on the board along with the printed conductors. Each pair of spaced-apart guide strips is more or less parallel to the conductor segments. However the adjacent edges of the strips of each pair converge from one end of the pair to the other. In other words, the passage between those edges has a slight taper.

The circuit to be connected to the PC board, say for example a flexible jumper cable, has a similar multiplicity of conductors which terminate as closely spaced parallel conductor segments at an end of the cable. The width of these conductor segments and their spacing is the same as the width and spacing of the conductor segments of the PC board. Also, the surfaces of those conductor segments are exposed on one face of the cable so that the circuit and PC board can be brought together with their corresponding conductor segments in registering face to face contact.

Affixed to the end of the flexible circuit on the face thereof opposite the exposed conductor segments is an alignment plate which extends transverse to those segments, the opposite ends of the plate extending beyond the side edges of the flexible circuit. At least one relatively long thin cantilevered leg extends laterally from the plate adjacent those side edges, the number and placement of legs corresponding to the number and placedment of the alignment guides on the PC board. Each leg is generally parallel to the conductor segments of the flexible circuit and it is bent out of the nominal plane of the plate so that it extends below the exposed surfaces of those conductor segments.

In accordance with this invention, the spacings of the cable conductor segments from the longitudinal centerline of each leg of the alignment plate is exactly the same as the spacings of PC board conductor segments from the centerline of each alignment guide passage. Also, each leg is narrower than the maximum width of the guide passage and preferably no wider than the minimum width thereof. The plate legs affixed to the cable and the alignment guides on the PC board are thus arranged and adapted so that when the cable is positioned against the PC board with the conductor segments of the two circuits in more or less registering face to face contact, the free end of each leg lies in the tapered passage of the corresponding alignment guide on the board. When the two circuits are now pressed together and clamped, such as by the connector described in the aforesaid pending patent application, the legs are flexed so that the free end of each leg slides along its tapered guide passage on the board. Resultantly, if the conductor segments of the two circuits are even slightly out of lateral register to one side or the other, each leg will be engaged by the edge of one or the other of its guide strips and be wedged sideways by that edge in the opposite direction toward the centerline of the tapered passage between the two strips. Thus by the time the flexible circuit is fully clamped to the PC board and each alignment plate leg has been moved to the narrow end of its alignment guide passage, the alignment plate and the flexible circuit to which it is attached will have been shifted laterally as necessary to bring the corresponding conductor segments of the two circuits into exact lateral register.

Preferably, the alignment plate is formed with a comb structure whose teeth are bowed or bent downwards out of the nominal plane of the plate toward the flexible circuit so that they resiliently engage the conductor segments of that circuit when the circuit is clamped to the PC board. Resultantly, each such conductor segment is pressed firmly against its counterpart on the PC board thereby assuring good compliant electrical connections between the two circuits.

With this arrangement, then, releasable electrical connections can be made even between so called fine line circuits. Now, connectors such as the one disclosed in the aforesaid application which align and clamp ordinary circuits can be used to achieve coarse alignment of fine line circuits, with fine alignment being produced by the present invention as the two circuits are clamped together. Since the alignment plate is a simple stamped or etched part and the guide strips on the PC board add virtually nothing to the cost of the board, greatly increased positioning accuracy between connected-together circuits can be obtained at minimum cost.

BRIEF DESCRIPTION OF THE DRAWINGS

For a fuller understanding of the nature and objects of the invention, reference should be had to the following detailed description, taken in connection with the accompanying drawings, in which.

DETAILED DESCRIPTION OF THE PREFERRED EMBODIMENT

Figure 1:
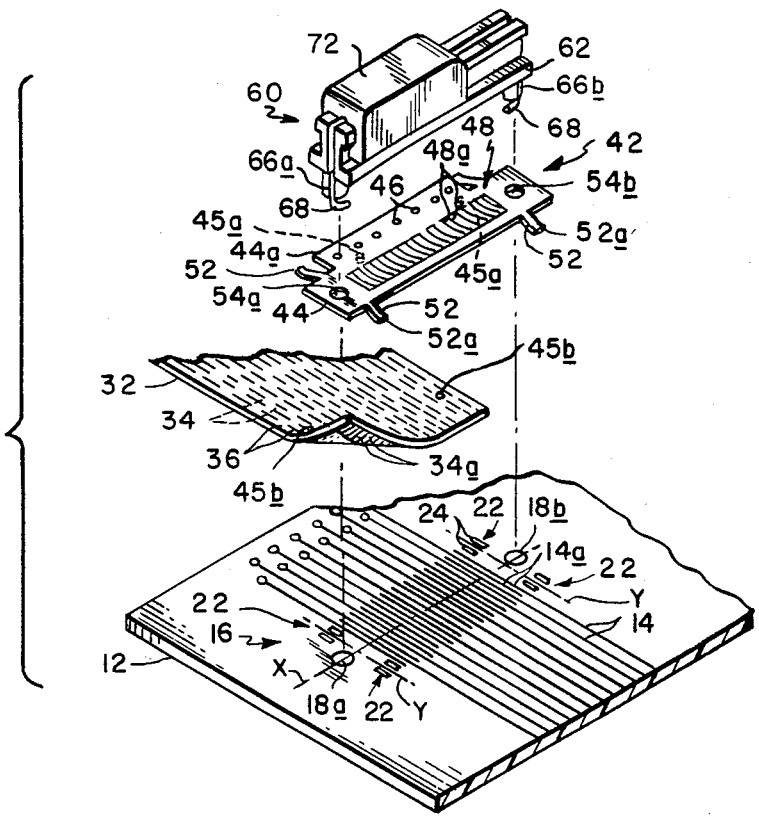
FIG. 1 is a fragmentary exploded perspective view illustrating the components of an electrical connection assembly embodying the principles of this invention.

Referring first to FIG. 1 of the drawing, a printed circuit board 12 has a multiplicity of printed conductors 14 thereon which are terminated in a connection area shown generally at 16 by closely spaced parallel conductor segments 14a. Spaced at opposite sides of the connection area 16 are a pair of holes 18a and 18b which extend through the PC board, the former hole having a slightly larger diameter than the latter hole and the centers of the holes being located on an axis X corresponding to the longitudinal centerline of area 16.

Figure 3:
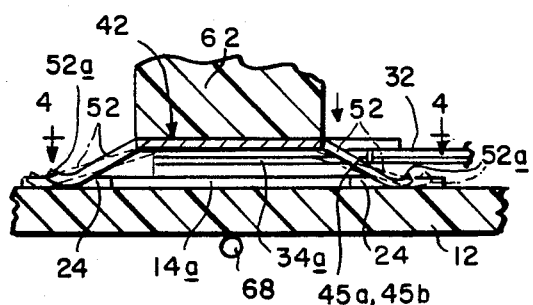
FIG. 3 is a sectional view along line 3—3 of FIG. 2.
Figure 4:
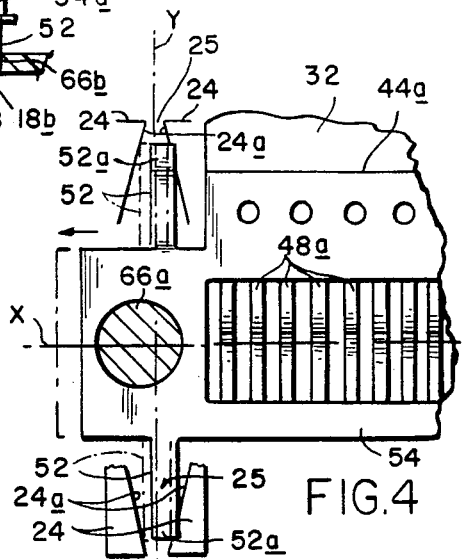
FIG. 4 is a sectional view along line 4—4 of FIG. 3.

Positioned just outboard of the two outermost conductor segments 14a are one or more alignment guides indicated generally at 22. In the arrangment specifically illustrated herein, there are two alignment guides 22 at each side of the connection area 16, with the two guides at each side of that area being centered on an axis Y which is perpendicular to axis X and parallel to the conductor segments 14a. As best seen in FIGS. 3 and 4, each guide 22, which is printed on the PC board along with the conductors 14 thereon, comprises a pair of spaced-apart raised guide strips 24 whose adjacent edges 24a converge to define a tapered passage 25 between the two strips, the passage centerline corresponding to axis Y. In the illustrated board 12, the wide end of each passage 25 is the one closest to axis X.

The circuit to be connected to the PC board 12 is illustrated as a flexible circuit or jumper cable 32 having a multiplicity of conductors 34 sandwiched between a pair of flexible electrical insulating layers 36. A segment of the lower layer 36 at the end of the cable is removed to expose conductor end segments 34a which segments have essentially the same length and width and spacing as the conductor segments 14a of the PC board 12. Also, there is one such segment 34a for each segment 14a so that when the flexible circuit is positioned on the PC board with its segments 34a located in the connection area 16 of the board, the corresponding conductor segments of the two circuits can be superimposed.

Referring again still referring to FIG. 1, the present connection assembly also includes an alignment plate shown generally at 42 which can be conveniently stamped out of metal or plastic sheet material. Alternatively, if metal, the plate can be formed by a standard masking and etching or chemical milling process. The plate includes a generally rectangular strip 44 having a integral tab 44a extending from one long edge of the strip, there being a series of spaced apart holes 46 through the extension tab for reasons that will be discussed presently. Strip 44 is formed with a generally rectangular comb shown generally at 48 which is centered on the strip opposite tab 44a. The area of comb 48 is more or less the same as the area 16 of the PC board 12. Comb 48 is composed of a series of very narrow, closely spaced, cantilevered teeth 48a which extend transversely of the strip and these teeth are bent so that they bow downwardly below the nominal plane of the plate. Also, strip 44 has pairs of cantilevered legs 52 which extend out laterally from the opposite long edges of strip 44 just inboard of holes 54a and 54b adjacent the opposite ends of the plate. The legs 52 are bent downwardly out of the nominal plane of plate 42 and their free ends or feet 52a are rounded or turned upwardly somewhat. Thus legs 52 constitute leaf springs capable of resiliently supporting the plate 42 when the plate is placed on a flat surface.

The alignment plate 42 is dimensioned with relation to the jumper cable 32 such that its tab 46 can be positioned crosswise at the end of that circuit on the insulated face thereof so that the exposed conductor segments 34a underly and face away from its comb 48. Accurate lateral positioning of the plate on the cable can be assured by engaging tiny pins 45a projecting down from plate strip 44 in holes 45b in the cable as shown in FIGS. 1 and 3. Tab 44a is bonded or cemented to the cable with the bonding agent being forced into the tab holes 46 to ensure a good mechanical connection between the plate and the cable. When the plate is anchored to the jumper as aforesaid, the conductor segments 34a are positioned under the downwardly bowed resilient comb teeth 48a so that the exposed surfaces of those conductor segments lie below the nominal plane of the plate and the ends of the legs 52 extend appreciably below those exposed surfaces.

The final component of the connection assembly is a clamping type connector indicated generally 60 in FIG. 1. The connector 60 may be any type of device that is able to clamp the plate 42 and attached cable 32 to the PC board 12. The connector specifically illustrated herein is similar to the one described fully in the above identified pending patent application Ser. No. 416,490 whose disclosure is specifically incorporated herein by reference. Briefly, the connector 60 comprises a plastic housing or frame 62 having a pair of depending locating posts or pins 66a and 66b positioned and sized to fit the holes 18a and 18b of the PC board 12. The frame carries a spring member (not shown) whose legs extend down through the posts 66a and 66b terminating as inwardly extending hooks 68. An actuating member 72 is slidably affixed to frame 62. Sliding the actuator in one direction along the frame, i.e. towards the right as viewed in FIG. 1, extends the hooks and spreads them apart; sliding the actuator in the opposite direction, i.e. toward the left, allows the hooks to spring together and retracts them towards the frame.

A connector like connector 60 is mounted to the end of the cable 32 so that the cable conductor segments 34a are located directly under the frame 62. The connector is clipped or clamped to the PC board by inserting its locating posts 66a and 66b through the PC board holes 18a and 18b with the connector hooks 58 spaced apart and extended. Normally, the locating of the connector posts in the PC board holes provides sufficiently accurate positioning to align or bring into lateral register the corresponding conductor segments of the two circuits. Accordingly, when the connector actuator 72 is moved leftward to its clamping position, the connector and cable are anchored to the PC board such that the corresponding conductors of the two circuits are in registering face-to-face contact. However, when the circuits have fine line conductors which are very narrow and closely spaced, the engagement of the connector posts in the PC board holes cannot position the two circuits accurately enough relative to one another to assure registering contact between their corresponding conductor segments.

The present assembly overcomes the aforesaid problem and permits a connector such as connector 60 to couple circuits of the fine line type. For this, the connector locating posts 66a and 66b are inserted through the holes 54a and 54b of plate 42 to secure the plate and attach cable 32 to the connector. Since the pins and holes at the opposite ends of the connector and plate have different diameters, the connector can only be mounted in one way to the plate. Then the connector is positioned on the PC board 12 so that its locating posts can be engaged in the PC board holes 18a and 18b. Again, because those holes have different diameters, the direction of the attachment of the plate and cable to the PC board is determined. The connector's actuator 60 is then moved rightward to spread apart and extend the connector's hooks 58 so that the connector frame can be seated on the PC board at its connection area 16, with the plate 42 being sandwiched in between.

The engagement of the locating posts 66a and 66b in the PC board holes provides a rough positioning of the plate relative to the board so that the plate's comb teeth 48a and the cable conductor segments 34a are more or less centered on the corresponding conductor segments 14a of the PC board. That rough positioning also places the ends 52a of the plate legs 52 opposite the alignment guides 22 on the board. More particularly, as best seen in FIGS. 3 and 4, each leg end 54a is located in the tapered passage 25 of its corresponding guide 22 near the wider end of that passage closer to the axis X. We will assume, for example, that such rough positioning has positioned the legs 52 as shown in solid lines in FIG. 4 wherein they are displaced laterally somewhat to the right of the axis Y. Thus, the cable conductor segments 34a are out of lateral register with the PC board's conductor segments 14a by that same amount.

Figure 2:
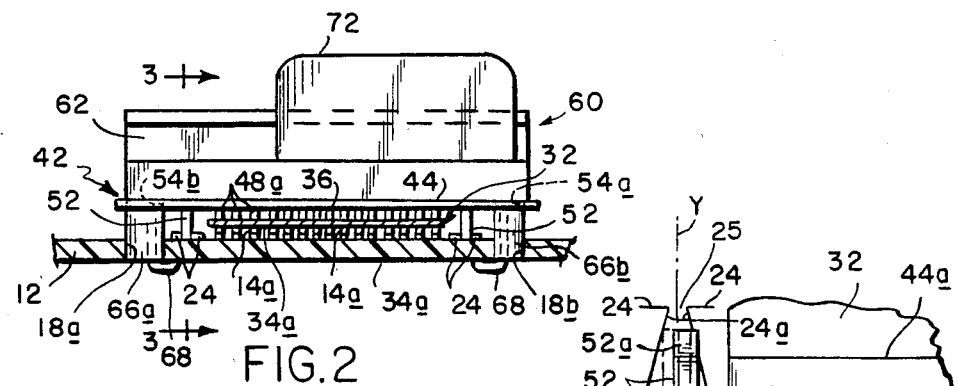
FIG. 2 is a front elevational view with parts in section showing the assembly in its connected together condition.

Now the connector's actuator 72 is moved leftward to its clamping position to clamp the connector and plate 42 to the PC board. This clamping action presses plate 42 toward the PC board as shown in dot-dash lines in FIG. 3 causing its legs 52 to flex outwardly. This flexing movement slides the end 52a of each leg outward along the passage 25 of its alignment guide 22. If the plate 42 is out of alignment with the board as it is in FIG. 4, the leg end will eventually engage the edge 24a of a guide strip 24, the right-hand strip in this example. That edge, which functions as a wedge or cam, moves the leg sideways to the left toward the axis Y. Such wedging engagements of the four legs with their respective right-hand guide strip edges 24a thus shifts the entire plate 42 as a whole along axis X toward the left as shown in dot-dash lines in FIG. 4 until the centerline of each pair of legs coincides exactly with the corresponding axis Y. This movement brings the cable conductor segments 34a exactly into register with the PC board's conductor segments 14a as shown in FIG. 2. Of course, lateral misalignment of the plate 42 and cable relative to the PC board in the opposite direction will result in the leg ends engaging the edges 42a of the left-hand guide strips 24 as the connector is clamped to the board. This will produce a rightward shifting of the plate and cable as needed to center the legs on their Y axes which will again place the conductor segments of the two circuits in exact lateral register.

Thus, the present assembly permits even fine line circuits to be electrically connected properly using a clamping type connector. Moreover, this is achieved without any appreciable increase in the cost of the overall connection assembly since the plate 42 is a simple formed part which is inexpensive to make and the cost of adding the guide strips 24 to the PC board is essentially nil. Accordingly, the present arrangement should find wide use wherever it is desired to releasably connect two electrical circuits, particularly those of the fine line type.

It will thus be seen that the objects set forth above, among those made apparent from the preceding description, are efficiently attained. Also, certain changes may be made in the above construction without departing from the scope of the invention. For example, if alignment of the cable 32 with the PC board along the Y axis is desired, say, to achieve registration between point contacts of two circuits, cantilevered legs similar to legs 52 can be provided at the opposite ends of plate 42 and arranged to engage alignment guides on the board which are centered on the axis X. In that event, when the plate is pressed against the board, the alignment guide strips will wedge those legs sideways along the Y axis to bring the corresponding conductors or contacts of the two circuits into proper alignment in the Y direction. Also, the alignment plate 42 could be affixed to the underside of cable 32, in which case the cable conductors could be connected electrically to the upper surfaces of comb teeth 48a, say, by suitably profiling the underside of the connector frame 62 to press the conductors into contact with the upper surfaces of those teeth. Therefore, it is intended that all matter contained in the above description or shown in the accompanying drawing be interpreted as illustrative and not in a limiting sense.

It is also to be understood that the following claims are intended to cover all of the generic and specific features of the invention herein described.

What is claimed as new and desired to be secured by Letters Patent of the United States is:

1. An electrical connection assembly comprising
   A. a first circuit having a generally flat contact area containing a plurality of exposed contacts;
   B. a second circuit having a generally flat contact area containing a plurality of exposed contacts, the contacts of the two circuits being arranged and adapted so that the two circuit contact areas can be juxtaposed with at least some of the contacts of the two circuits being in face-to-face engagement and one of said circuits comprising an insulating substrate whose said contacts are printed on said substrate;
   C. guide means affixed to said one circuit adjacent its said contact area, said guide means comprising raised areas printed on the substrate;
   D. flexible alignment means affixed to the other circuit, said alignment means
      (1) being positioned adjacent to said guide means when the two circuits are juxtaposed with their engaging contacts in gross registration, and
      (2) flexing when the two circuit contact areas are clamped together so that the alignment means engage said guide means and are shifted thereby in a direction that brings said engaging contacts into fine registration; and
   E. means for clamping the two circuit contact areas together so that said some contacts of the two circuits are maintained in face-to-face engagement.

2. The assembly defined in claim 1 wherein the alignment means are affixed to the opposite surface of said other circuit from the exposed contacts thereon.

3. The assembly defined in claim 2 wherein the alignment means extend beyond said contact area of said other circuit.

4. The assembly defined in claim 3 wherein the alignment means include a plurality of elongated resilient members which extend from the extending portion of the alignment means through the general plane defined by said other circuit contacts.

5. The assembly defined in claim 2 wherein the alignment means include compliant means for resiliently pressing said other circuit contact area against said one circuit contact area when the two circuit contact areas are clamped together by said clamping means.

6. The assembly defined in claim 5 wherein the compliant means includes a plurality of resilient leafsprings which curve toward and register with said other circuit contacts.

7. The assembly defined in claim 1 wherein said other circuit is a flexible jumper cable whose contact area is located at an end of the cable.

8. The assembly defined in claim 7 wherein said alignment means comprise
   A. a generally flat plate affixed to said cable end opposite its said contact area, said plate extending beyond and overhanging the opposite side edges of the cable; and
   B. a plurality of generally parallel, cantilevered spring legs extending from the overhanging portions of said plate beyond the contacts of said cable so that, when the two circuit contact areas are clamped together, the legs engage the one circuit before the corresponding contacts of the two circuits engage one another.

9. The assembly defined in claim 8 wherein
   A. the one circuit comprises a PC board including an insulating substrate whose said contacts are printed on the substrate; and
   B. said guide means comprise raised wedge-shaped areas printed on said substrate at locations thereon adjacent to said engaging plate legs.

10. The assembly defined in claim 9 and further including a plurality of small resilient leafsprings struck from said plate in register with said other circuit contacts, said leafsprings being bowed out of the general plane of said plate toward said other circuit contact area so that they compliantly engage said other circuit contact area when the two circuits are clamped together.

11. Apparatus for aligning the corresponding contacts of two circuits in an electrical connection assembly comprising
   A. a generally flat alignment plate;
   B. means on the plate for connecting to a printed circuit;
   C. a set of elongated parallel cantilevered resilient members
      (1) extending from at least one edge of said plate, and
      (2) being bent in substantially the same way from the general plane of said plate so as to form a set of leafsprings;
   D. a second printed circuit comprising a substrate and contacts along with raised guide means printed on the substrate, said guide means being adapted to be engaged by said resilient members when said plate is pressed against said second circuit so as to shift said plate generally parallel to said second circuit in a direction to bring the contacts of the two circuits into close alignment; and
   E. means for pressing said plate against and clamping it to said second circuit.

12. The apparatus defined in claim 11 and further including a plurality of small cantilevered leafsprings struck from the plate so that they extend from the general plane of the plate in the same general direction as the resilient members.

13. The apparatus defined in claim 12 wherein
   A. the plate is generally rectangular; and
   B. the resilient members extend perpendicularly from opposite long edges of the plate.

14. The apparatus defined in claim 13 and further including a pair of plate through-holes adjacent the opposite ends of the plate.

15. The apparatus defined in claim 14 wherein the plate includes an integral circuit-attaching tab extending from a long edge of the plate inboard of said through holes.

* * * * *